United States Patent
Kono et al.

(10) Patent No.: US 7,598,746 B2
(45) Date of Patent: Oct. 6, 2009

(54) SURFACE VOLTMETER AND SURFACE VOLTAGE MEASUREMENT METHOD

(75) Inventors: Motohiro Kono, Kyoto (JP); Kazuhiko Fuse, Kyoto (JP); Yoshiyuki Nakazawa, Kyoto (JP)

(73) Assignee: Dainippon Screen Mfg. Co., Ltd., Kyoto (JP)

( * ) Notice: Subject to any disclaimer, the term of this patent is extended or adjusted under 35 U.S.C. 154(b) by 204 days.

(21) Appl. No.: 11/715,846

(22) Filed: Mar. 9, 2007

(65) Prior Publication Data

US 2007/0216418 A1      Sep. 20, 2007

(30) Foreign Application Priority Data

Mar. 10, 2006   (JP) ............................ P2006-065057

(51) Int. Cl.
    *G01R 29/12*   (2006.01)
(52) U.S. Cl. .................. 324/458; 324/661; 324/750
(58) Field of Classification Search ......... 324/661–663, 324/713, 765, 754, 458, 750, 73.1, 158.1
    See application file for complete search history.

(56) References Cited

U.S. PATENT DOCUMENTS 5,742,172 A * 4/1998 Yasutake .................... 324/754
6,014,028 A * 1/2000 Ohashi et al. ............... 324/661
2006/0267622 A1* 11/2006 Lagowski et al. ........... 324/765

FOREIGN PATENT DOCUMENTS

JP     8-153762 A     6/1996
JP     9-211046 A     8/1997

* cited by examiner

*Primary Examiner*—Vincent Q Nguyen
(74) *Attorney, Agent, or Firm*—McDermott Will & Emery LLP

(57) ABSTRACT

A surface voltmeter has a stage having a conductive surface, a vibrating electrode, a vibration part, and an elevation mechanism. While vibrating the vibrating electrode, displacement current from the conductive surface is acquired. A control part controls electrode voltage so that the displacement current becomes a value specified by a computer, and acquires a relationship between the displacement current and the electrode voltage while changing the displacement current. Acquisition of the relationship is performed a plurality of times while changing distance between the vibrating electrode and an object, the electrode voltage which is independent from the distance between the vibrating electrode and the object is obtained as reference voltage, and surface voltage on the object is obtained on the basis of the reference voltage. This makes it possible to remove effects of stray capacitances between the vibrating electrode and other constituent elements therearound from measurement, and easily perform higher-precision measurement.

20 Claims, 6 Drawing Sheets

SURFACE VOLTMETER AND SURFACE VOLTAGE MEASUREMENT METHOD

BACKGROUND OF THE INVENTION

1. Field of the Invention

The present invention relates to a surface voltmeter and a surface voltage measurement method for measuring a surface voltage on an object.

2. Description of the Background Art

Conventionally, a noncontact-type surface voltmeter has been used for measuring a surface voltage (surface potential) on a photosensitive drum of a copy machine or a substrate having an IC mounted thereon, and some types of surface voltmeters utilize an alternating current (AC) method. In the AC method, a vibrating electrode is positioned close to an object to be measured, and a surface voltage is obtained on the basis of a current from the vibrating electrode which is generated by change of a capacitance between the vibrating electrode and the object. For example, in Japanese Patent Application Laid-Open No. 9-211046 (Document 1), a distance between a vibrating electrode and an object is estimated by detecting change of a current from the vibrating electrode while changing a voltage (electrical potential) of the vibrating electrode, and a surface voltage on the object is obtained by correcting a voltage of the vibrating electrode in a condition where a current from the vibrating electrode is 0 on the basis of the estimated distance.

Japanese Patent Application Laid-Open No. 8-153762 (Document 2) discloses an apparatus having a similar structure to the surface voltmeter, wherein a distance between two objects is changed while applying a voltage to one object and a current from the other object is measured, whereby a difference between work functions of the two objects is obtained.

Since the AC method has merits of easily measuring the surface voltage in a noncontact manner and measuring charge on a surface of an insulating film, it has been started to be applied for preventing charging caused by manufacturing process of a semiconductor substrate and for evaluating an insulating film.

As described above, the conventional surface voltmeter detects a current, which depends on displacement of the electrode, from the vibrating electrode. However, since various parts relating to vibration, such as a cover, are arranged around the vibrating electrode, not only the capacitance between the object and the vibrating electrode but stray capacitances between the parts around the vibrating electrode and the vibrating electrode, change due to vibration of the vibrating electrode. Further, since a range of errors in a measurement result greatly varies according to change of the distance between the vibrating electrode and the object, a complicated operation is necessary for calibration of a measurement value as disclosed in Document 1.

In addition, an object to be measured in the conventional surface voltmeter is a surface voltage on an object which is charged at a high voltage (for example, several kV), therefore, it is not suitable for measurement of a small voltage which is required for evaluation of a semiconductor.

SUMMARY OF THE INVENTION

The present invention is intended for a surface voltmeter for measuring a surface voltage on a plate-like object. It is an object of the present invention to easily perform higher-precision measurement of the surface voltage.

The surface voltmeter according to the present invention comprises a stage having a conductive surface on which a plate-like object is placed; a vibrating electrode facing a surface of the object in a noncontact manner; a vibration part for vibrating the vibrating electrode in a direction toward the object; a control part which acquires a relationship between displacement current from the conductive surface while vibrating the vibrating electrode and electrode voltage of the vibrating electrode; a measurement condition changing part which changes a measurement condition for changing a relationship between displacement current and electrode voltage; and an operation part for obtaining a surface voltage on the object from a plurality of relationships between displacement current and electrode voltage, the plurality of relationships corresponding to a plurality of measurement conditions.

In the surface voltmeter, since displacement current from the conductive surface of the stage is acquired, it is possible to remove effects of stray capacitances between the vibrating electrode and other constituent elements around the vibrating electrode from a measurement, and easily perform higher-precision measurement.

According to a preferred embodiment of the present invention, the control part obtains electrode voltages where values of displacement currents are respectively made equal to specified current values, through feedback control. This makes it possible to make a voltage difference between the object and the vibrating electrode an approximately desired extent, and stably obtain a measurement result. More preferably, electrode voltages are directly obtained in acquiring a relationship between displacement current and electrode voltage, thereby more increasing a measurement accuracy.

According to another preferred embodiment of the present invention, the measurement condition changing part is a mechanism for changing a distance between the vibrating electrode and the surface of the object, and a measurement condition can be mechanically and easily changed. According to still another preferred embodiment of the present invention, the measurement condition changing part is a circuit for changing an amplitude of the vibrating electrode, and a measurement condition can be electrically and easily changed.

Preferably, the operation part obtains a reference voltage of the vibrating electrode which is independent from the plurality of measurement conditions, from the plurality of relationships between the displacement current and the electrode voltage, and obtains a surface voltage on the object on the basis of the reference voltage.

The present invention is intended for a surface voltage measurement method of measuring a surface voltage on a plate-like object.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
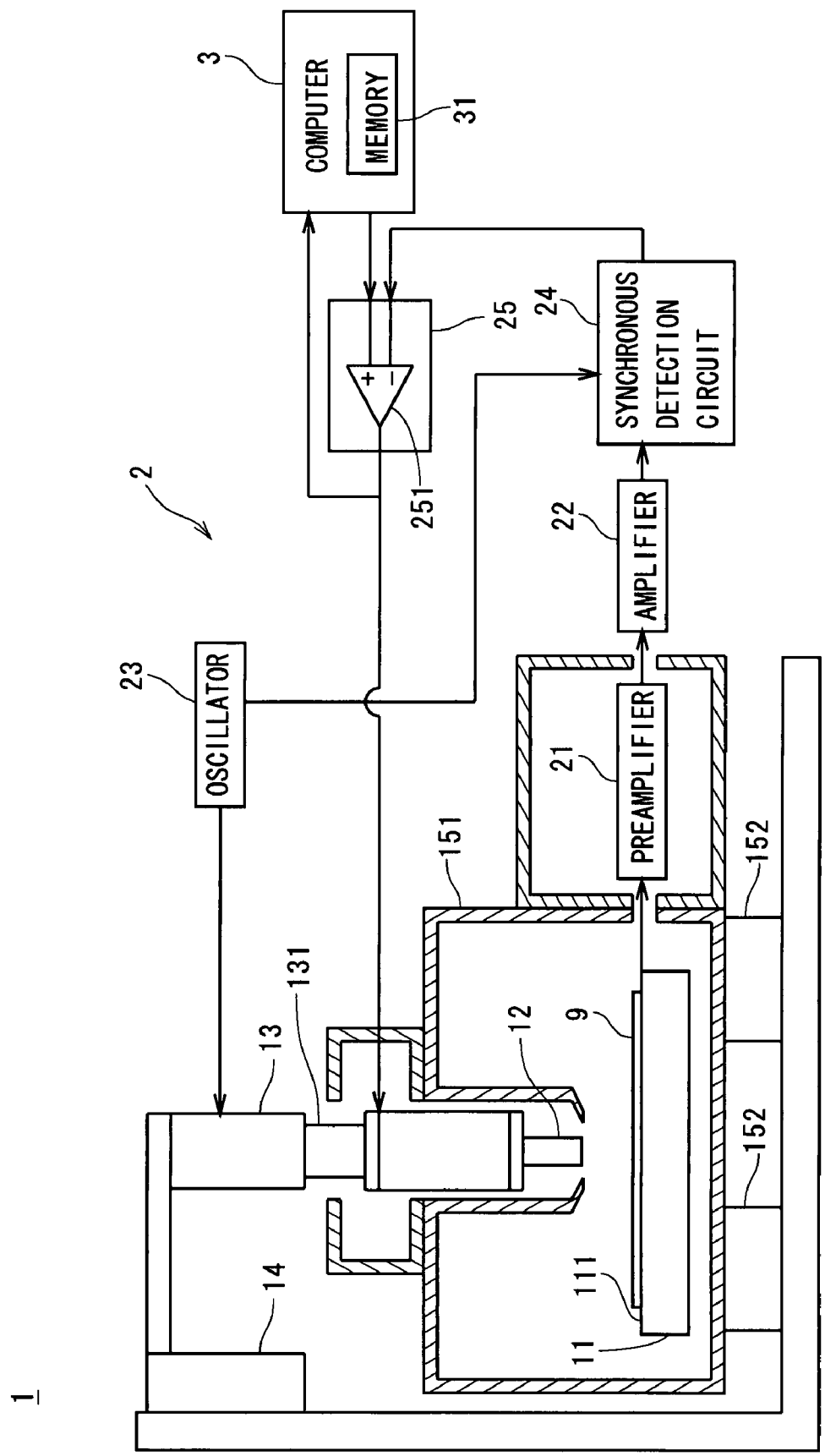
FIG. 1 is a view showing a construction of a surface voltmeter.

FIG. 1 is a view showing a construction of a surface voltmeter 1 in accordance with the first preferred embodiment of the present invention. The surface voltmeter 1 measures a surface voltage (surface potential) on a plate-like object 9, which is a semiconductor substrate such as a semiconductor wafer, with using a vibrating capacity method that is a kind of alternating current (AC) method. The surface voltmeter 1 comprises a stage 11 holding the object 9 by suction, a vibrating electrode 12 located above the stage 11, a vibration part 13 connected to the vibrating electrode 12, an elevation mechanism 14 for moving upward and downward the vibrating electrode 12, a control part 2 which is a group of circuits for processing various electrical signals and devices, and a computer 3 which is an operation part.

The stage 11 has a conductive surface 111 on which the object 9 is placed with its rear surface (lower surface) contacting therewith, and the vibrating electrode 12 faces a front surface (upper surface) of the object 9 and the conductive surface 111 in a noncontact manner. An area of the conductive surface 111 is much larger than that of a lower end of the vibrating electrode 12. The stage 11 is a XY stage and moves the object 9 in horizontal directions so that the desired portion of the object 9 faces the vibrating electrode 12. The vibrating electrode 12 is attached to the vibration part 13 having a piezo actuator (piezoelectric element) with interposing an insulating part 131, and the vibration part 13 vibrates the vibrating electrode 12 in a direction toward the object 9. The vibration part 13 is connected to the elevation mechanism 14, and the distance between the vibrating electrode 12 and the object 9 is changed by driving the elevation mechanism 14. A protective cover covers around the vibrating electrode 12, and a cover 151 covers around the stage 11. The cover 151 and the stage 11 are supported by vibration isolation members 152.

The control part 2 comprises a preamplifier 21 which converts and amplifies a small current generated and transmitted from the conductive surface 111 of the stage 11 into a voltage, an amplifier 22 for further amplifying a signal from the preamplifier 21, an oscillator 23 for applying a signal for vibration to the vibration part 13, a synchronous detection circuit 24 to which signals from the oscillator 23 and the amplifier 22 are inputted, and a control circuit 25 including an operational amplifier 251. A current from the conductive surface 111 is an alternating current which is generated by change of a capacitance between the vibrating electrode 12 and the object 9 while vibrating the vibrating electrode 12, and the current is hereinafter referred to as a "displacement current".

In the preamplifier 21, a voltage converted from a current value is amplified by approximately 10 to the 10th power times, and further amplified by approximately 10 squared times in the amplifier 22. With this operation, for example, a current of 10 fA (femtoampere) is directed to the operational amplifier 251 as a voltage of about 1 mV. A voltage from the control circuit 25 is applied to the vibrating electrode 12. A voltage indicating a displacement current from the amplifier 22 and a signal from the oscillator 23 are inputted to the synchronous detection circuit 24, and an amplitude of the displacement current is outputted from the synchronous detection circuit 24 as an amount of displacement current and inputted to an inverting input terminal (−) of the operational amplifier 251 in the control circuit 25.

A current specifying voltage for specifying an amount of displacement current is inputted to a non-inverting input terminal (+) of the operational amplifier 251 from the computer 3, and the operational amplifier 251 applies a voltage (electrical potential) to the vibrating electrode 12 so that an inputted voltage from the synchronous detection circuit 24 is equal to the current specifying voltage. In other words, the control part 2 performs feedback control with the operational amplifier 251 and an electrode voltage (electrode potential) where a value of the displacement current from the conductive surface 111 is made equal to a specified current value is obtained. The voltage determined by the control circuit 25 is directly acquired by the computer 3.

Figure 2:
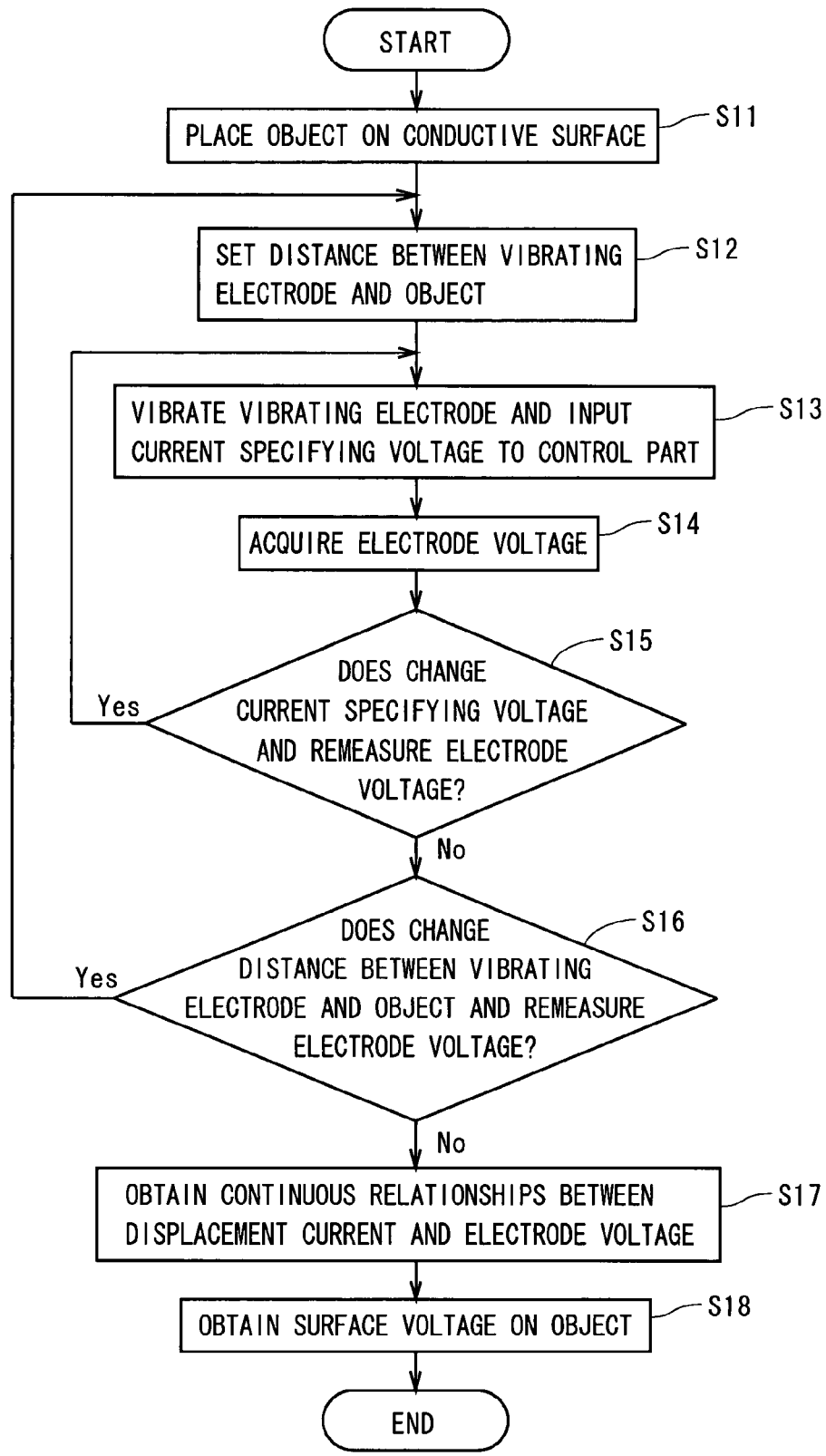
FIG. 2 is a flowchart showing an operation flow of the surface voltmeter.

FIG. 2 is a flowchart showing an operation flow of the surface voltmeter 1 in measuring a surface voltage on the object 9. First, the object 9 is placed on the conductive surface 111 so that the rear surface of the object 9 contacts the conductive surface 111 of the stage 11 (Step S11), and the vibrating electrode 12 faces the front surface of the object 9 and the conductive surface 111 in a noncontact manner. The elevation mechanism 14 sets a distance between the vibrating electrode 12 and the front surface of the object 9 (or the conductive surface 111) to a predetermine distance (Step S12).

Vibration of the vibrating electrode 12 in a direction toward the object 9 is started by the vibration part 13 and a predetermined current specifying voltage is inputted from the computer 3 to the control circuit 25 (Step S13). With this operation, feedback control is performed on a voltage of the vibrating electrode 12 (hereinafter, referred to as "electrode voltage") so that a value of the displacement current from the conductive surface 111 (i.e., the maximum value of an absolute value of current) is made equal to a value indicated by the current specifying voltage. Then, the above electrode voltage is inputted to the computer 3 (Step S14).

After acquisition of the electrode voltage, the operation is returned back to Step S13, the current specifying voltage is changed to perform reacquisition of the electrode voltage (Step S14). Change of the current specifying voltage and acquisition of the electrode voltage are repeated a plurality of times (Steps S14, S15) and a relationship between the displacement current and the electrode voltage (i.e., a plurality of combinations between the displacement currents and the electrode voltages) are obtained.

After a relationship between the displacement current and the electrode voltage is obtained in a state where the distance between the vibrating electrode 12 and the object 9 is kept constant, the operation is returned back to Step S12 (Step S16), the elevation mechanism 14 changes the distance between the vibrating electrode 12 and the front surface of the object 9, and change of the current specifying voltage and acquisition of the electrode voltage are repeated a plurality of times to obtain a relationship between the displacement current and the electrode voltage (Steps S13 to S15). Then, change of the distance between the vibrating electrode 12 and the front surface of the object 9 and acquisition of the relationship between the displacement current and the electrode voltage are repeated a predetermined times, to obtain a plurality of relationships between the displacement current and the electrode voltage (Steps S12 to S16).

Figure 3:
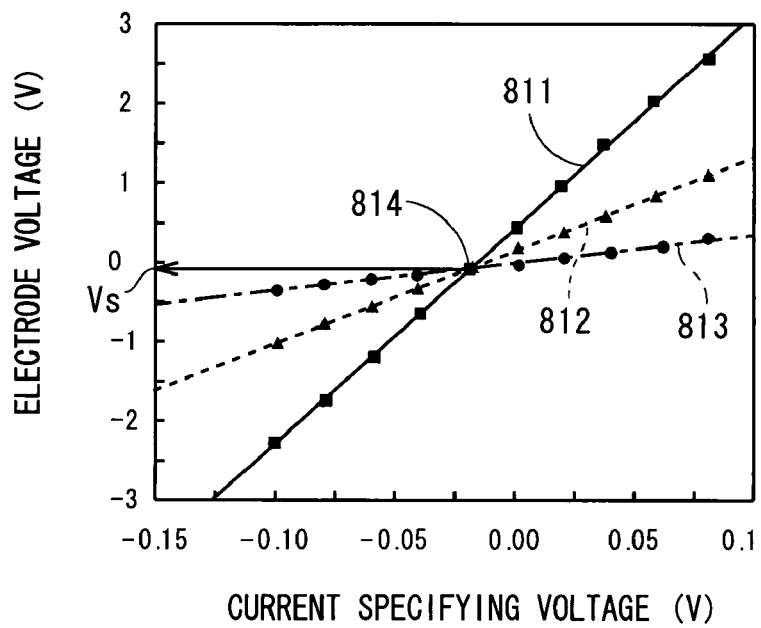
FIG. 3 is a graph showing relationships between current specifying voltage and electrode voltage.

FIG. 3 is a graph showing relationships between the current specifying voltage (i.e., displacement current) and the electrode voltage. Squares represent combinations (discrete relationship) between the current specifying voltages and the electrode voltages which are obtained in a state where the distance between the vibrating electrode 12 and the front surface of the object 9 is kept constant. A solid line 811 is a straight line which is obtained from the squares with the least squares method and represents a continuous linear relationship between the displacement current and the electrode voltage. Triangles represent measurement results which are obtained in a state where the distance between the vibrating electrode 12 and the front surface of the object 9 is made shorter than that in the above case of squares. Circles represent measurement results which are obtained in a state where the distance between the vibrating electrode 12 and the front surface of the object 9 is made still shorter than that in the case of triangles. A dashed line 812 is a straight line derived from the triangles and a dot-and-dash line 813 is a straight line derived from the circles.

As shown by the straight lines 811 to 813 in FIG. 3, the relationship between the displacement current and the electrode voltage is represented linearly, and as the distance between the vibrating electrode 12 and the front surface of the object 9 increases, the tilt angle of line increases. The straight lines 811 to 813 meet at a point 814. It is confirmed that if the distance between the vibrating electrode 12 and the front surface of the object 9 is further changed to obtain another straight line, the another straight line passes through the point 814. Since the point 814 is independent from the distance between the vibrating electrode 12 and the front surface of the object 9, it is assumed that the displacement current is not actually generated at the point 814 by change of the capacitance between the vibrating electrode 12 and the object 9. Therefore, in principle, it is presumed that the electrode voltage (hereinafter, referred to as "reference voltage Vs") and the surface voltage on the object 9 are equal at the point 814. In other words, a measurement value of the displacement current at the point 814 is not 0 because of various factors such as shape of the vibrating electrode 12 or noises generated in the circuit, but it can be achieved that a deviation from 0 of the displacement current is swept by determining the point 814, to obtain the reference voltage Vs.

In the computer 3, the above-discussed plurality of straight lines 811 to 813 representing the plurality of continuous relationships are obtained from the plurality of discrete relationships between the displacement currents and the electrode voltages which are acquired through control of the control part 2 (Step S17), and the reference voltage Vs is obtained as the surface voltage on the object 9 by determining the intersection point 814 of the plurality of straight lines (Step S18).

Next, discussion will be made on a principle of higher-precision measurement performed by the surface voltmeter 1. Normally, a capacitance C between the vibrating electrode 12 and the object 9 is expressed by Eq. 1, where ω is an angular frequency of the vibration part 13, S is an area of the lower end of the vibrating electrode 12, d is a distance between the vibrating electrode 12 and the front surface of the object 9, Δd is an amplitude width of the vibrating electrode 12, and $\in$ is a dielectric constant of air.

$$C(t) = S\frac{\varepsilon}{d + \Delta d \sin(\omega t)} \quad \text{Eq. 1}$$

A displacement current i is expressed by Eq. 2, where a surface voltage on the object 9 is V. $C_0$ in Eq. 2 is expressed in Eq. 3.

$$i(t) = -VC_0\frac{\Delta d}{d}\omega\cos(\omega t) \quad \text{Eq. 2}$$

$$C_0 = S\frac{\varepsilon}{d} \quad \text{Eq. 3}$$

As shown in Eq. 2, the displacement current i is proportional to the surface voltage V on the object 9 and depends on the distance d. In measurement, the surface voltage V can be theoretically obtained by measuring the distance d which is a variable, however actually, an accurate measurement result cannot be obtained in the above computations because of various error factors.

Figure 4A:
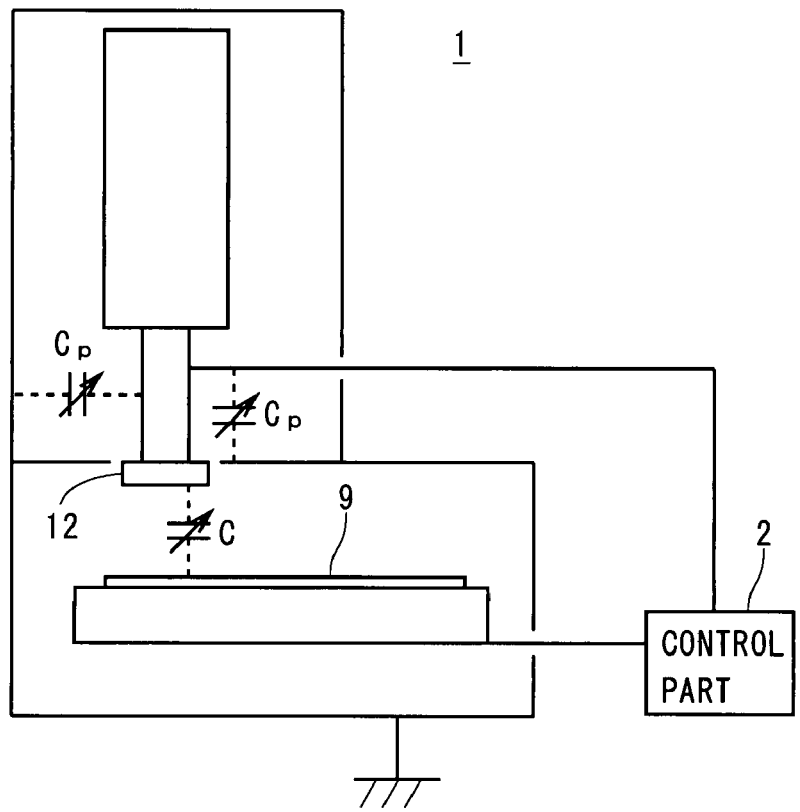
FIG. 4A is a schematic view of the surface voltmeter.
Figure 4B:
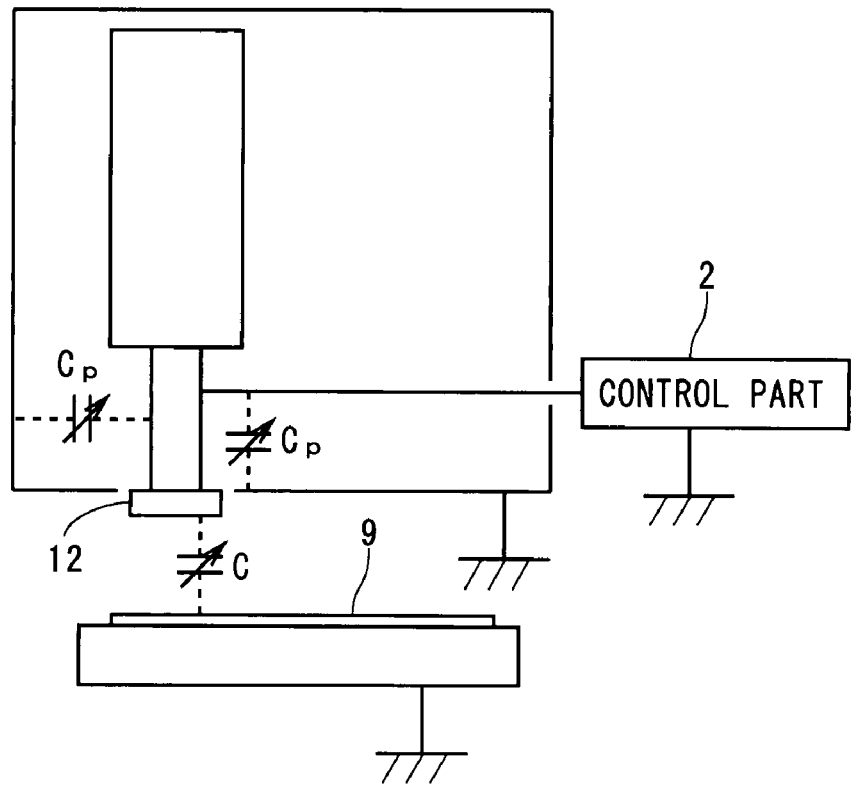
FIG. 4B is a view showing a schematic view of a surface voltmeter in accordance with a comparative example.

FIG. 4A is a schematic view of the surface voltmeter 1 shown in FIG. 1, and FIG. 4B is a view showing a surface voltmeter 100 in accordance with a comparative example where the control part 2 for detecting the displacement current is connected to the vibrating electrode 12. As shown in FIGS. 4A and 4B, since each of the vibrating electrodes 12 of the surface voltmeters 1, 100 is housed in a cover which is grounded, various stray capacitances Cp are generated around the vibrating electrode 12, for example, between the vibrating electrode 12 and the cover or other constituent elements around the vibrating electrode 12, other than a capacitance C between the vibrating electrode 12 and the object 9.

Figure 5A:
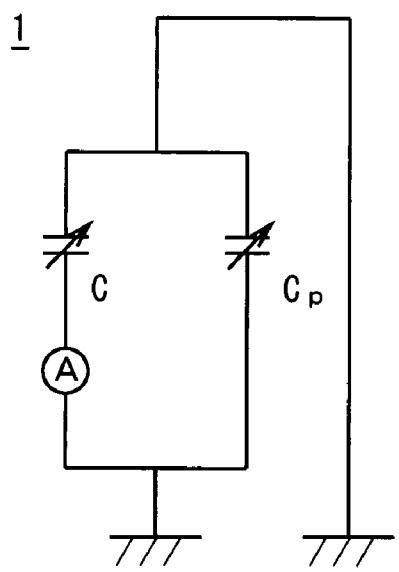
FIG. 5A is a circuit diagram schematically showing connections between a capacitance and a stray capacitance and an ampere meter.
Figure 5B:
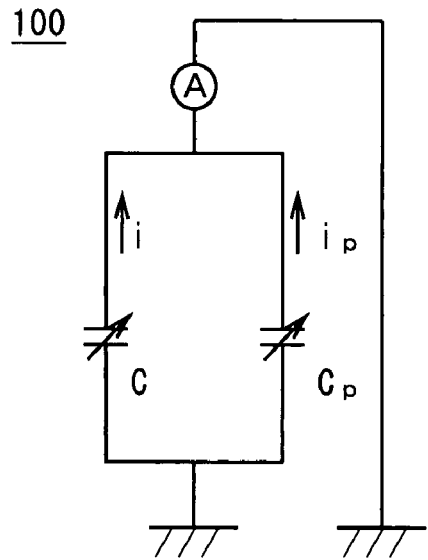
FIG. 5B is a circuit diagram schematically showing connections between a capacitance and a stray capacitance and an ampere meter in accordance with the comparative example.

FIG. 5A is a circuit diagram schematically showing a relationship between the capacitance C and the stray capacitance Cp of FIG. 4A and an ampere meter corresponding to the control part 2, and FIG. 5B is a circuit diagram schematically showing a relationship between the capacitance C and the stray capacitance Cp of FIG. 4B and an ampere meter corresponding to the control part 2. In vibrating the vibrating electrode 12, not only the capacitance C between the vibrating electrode 12 and the object 9 but also the stray capacitance Cp varies. As shown in FIG. 5B, in the surface voltmeter 100 of the comparative example, since the displacement current is detected from the vibrating electrode 12, the displacement current includes currents generated by variations in both of the capacitance C and the stray capacitance Cp, and the precision of measurement is limited to about several tens mV. On the other hand, as shown in FIG. 4A, in the surface voltmeter 1, since a function for detecting current is removed from the vibrating electrode 12 and the displacement current is obtained from the stage 11, the displacement current is affected by only a variation of the capacitance C as shown in FIG. 5A. As a result, it is possible to remove errors caused by the stray capacitance Cp from the displacement current and easily achieve higher-precision measurement.

In the surface voltmeter 1, it is possible to obtain the relationship between the displacement current and the electrode voltage by specifying the electrode voltage and detecting a value of the displacement current, however in this case, a difference between the specified electrode voltage and the surface voltage on the object 9 can be large and it increases measurement errors. In the surface voltmeter 1, by specifying a relatively small value as a value of the displacement current, the difference between the electrode voltage and the surface voltage can be made an approximately desired extent and a measurement result can be stably obtained.

In the surface voltmeter 1, since an accurate electrode voltage is directly acquired and transmitted to the computer 3 by the control part 2, it is possible to improve the accuracy of the obtained reference voltage and the measurement accuracy of the surface voltage on the object 9.

Next discussion will be made on a calibration operation (so-called zero calibration) performed by the surface voltmeter 1. As discussed above, in principle, the reference voltage obtained by the computer 3 is equal to the surface voltage on the object 9, however, if an allowable value of measurement errors is small, there is a case where a measurement result includes errors over the allowable value, depending on a state of the conductive surface 111 of the stage 11, materials or a state of surface of the vibrating electrode 12 or the object 9, or the like. In such a case, a calibration operation is performed by the surface voltmeter 1 in advance.

In the calibration operation, Steps S12 to S18 of FIG. 2 are performed in a state where the object 9 is not placed on the stage 11, and a surface voltage obtained through Steps S12 to S18 is errors in the surface voltmeter 1. The surface voltage is set to the computer 3 shown in FIG. 1 and stored in a memory 31. The object 9 is placed on the stage 11 and the above-discussed measurement operations are performed to obtain the reference voltage Vs of the vibrating electrode 12. Further, the value stored in the memory 31 is subtracted from the reference voltage Vs (or a value whose sign is changed is stored in the memory 31 and the value may be added to the reference voltage Vs), to obtain the final surface voltage.

In the conventional surface voltmeter, since the distance between the vibrating electrode and the object complicatedly affects measurement errors, a complicated calibration operation needs to be performed every time when the distance between the vibrating electrode and the object is changed. However, in the surface voltmeter 1, since effects of the stray capacitance can be removed and an operation for accurately measuring the distance between the vibrating electrode and the front surface of the object is not necessary, higher-precision measurement can be achieved through the easy calibration operation.

Figure 6:
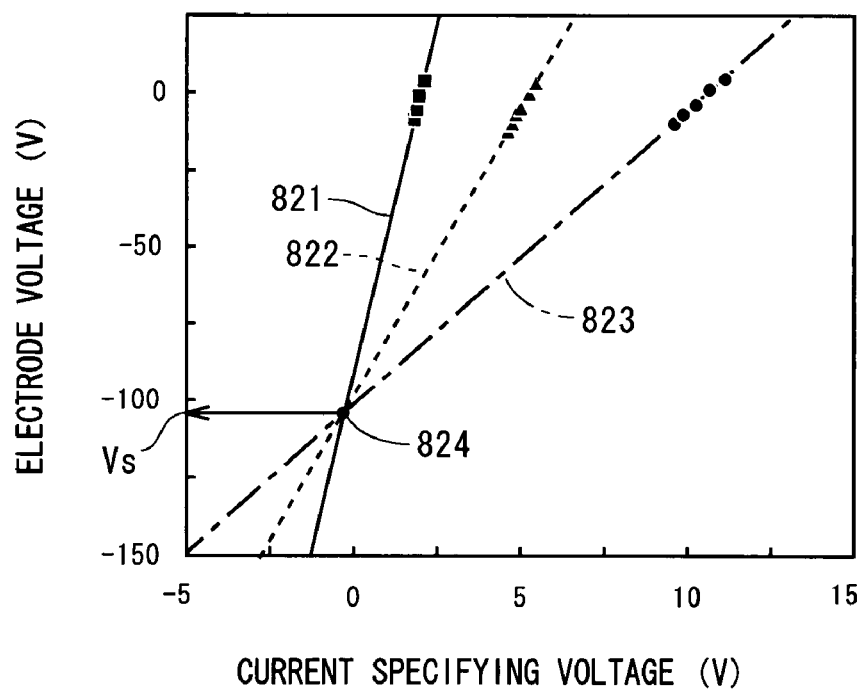
FIG. 6 is a graph showing another example of an operation for obtaining a reference voltage.

FIG. 6 is a graph showing another example of an operation for obtaining the reference voltage in the computer 3 and shows an example of measurement of a surface voltage which is out of a range of outputted voltage from the operational amplifier 251 shown in FIG. 1. Similarly to the case of FIG. 3, straight lines 821, 822 and 823 in FIG. 6 represent a plurality of continuous relationships between the displacement current and the electrode voltage which are obtained by changing the distance between the vibrating electrode 12 and the object 9, and the straight lines 821 to 823 meet at a point 824. Even if the absolute value of the surface voltage is large and the reference voltage Vs (and the surface voltage) is out of a range of the electrode voltage in measurement, the surface voltage can be obtained as long as the intersection point of the plurality of straight lines can be determined as shown in FIG. 6.

Since the above-discussed measurement is performed by the surface voltmeter 1, the operational amplifier 251 can perform measurement in a range of voltage which can be generated, without providing a high voltage generator having a complicated control circuit, and it is possible to achieve simplification of the construction and reduction of the manufacturing costs of the surface voltmeter 1. Further, not applying a high voltage to the vibrating electrode 12 makes the use of the surface voltmeter 1 easy.

Figure 7:
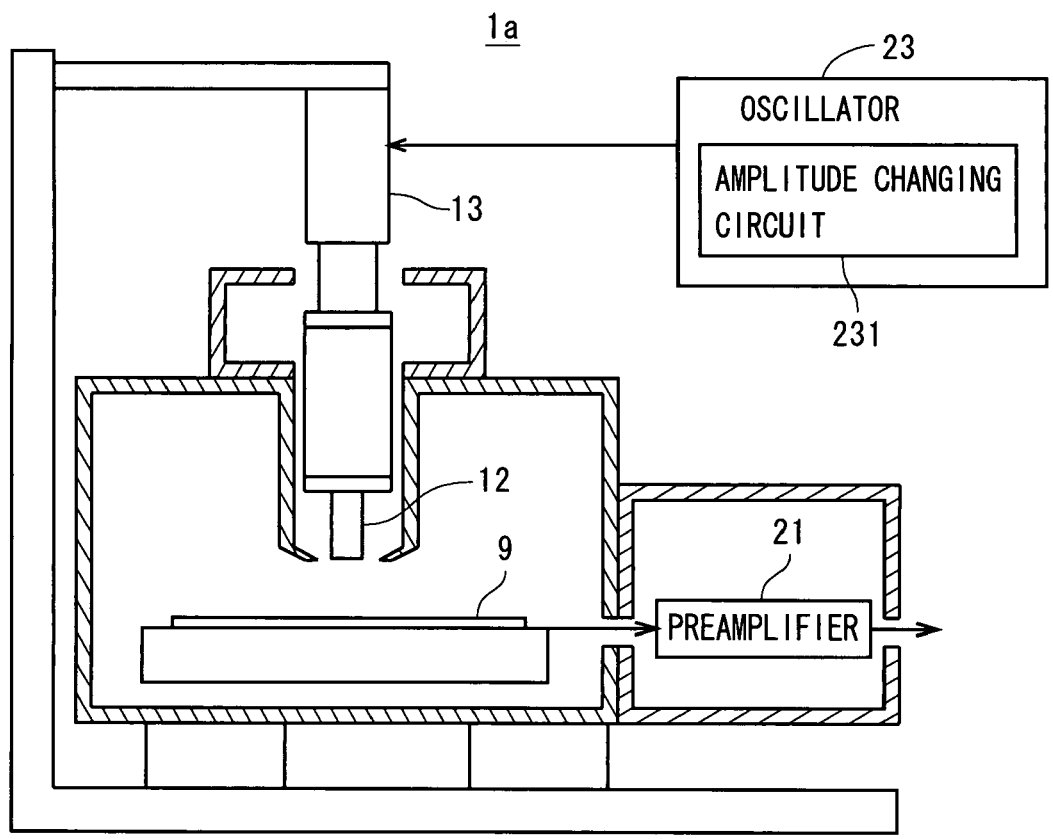
FIG. 7 is a view showing a construction of another surface voltmeter.

FIG. 7 is a view showing a surface voltmeter 1a in accordance with the second preferred embodiment of the present invention. The surface voltmeter 1a is different from the surface voltmeter 1 shown in FIG. 1 in that the elevation mechanism 14 for the vibrating electrode 12 is omitted and the oscillator 23 is provided with an amplitude changing circuit 231. Other constituent elements are the same as those of FIG. 1, and a part of the control part 2 and the computer 3 are not shown in FIG. 7.

Figure 8:
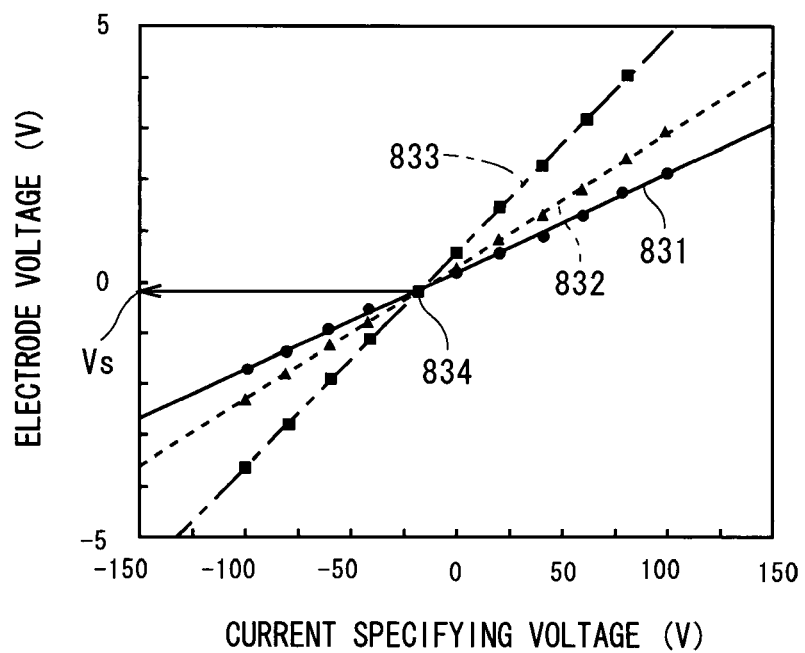
FIG. 8 is a graph showing relationships between current specifying voltage and electrode voltage.

Operations of the surface voltmeter 1a are different from those of the surface voltmeter 1 in that the amplitude changing circuit 231 changes an amplitude of the vibrating electrode 12 in stead of change of the distance between the vibrating electrode 12 and the front surface of the object 9 in Step S12 of FIG. 2, and the other operations are the same as those of FIG. 2. FIG. 8 is a graph showing relationships between the current specifying voltage (displacement current) and the electrode voltage which are obtained by the surface voltmeter 1a. In FIG. 8, circles represent combinations (discrete relationship) between the current specifying voltages and the electrode voltages which are obtained in a state where the distance between the vibrating electrode 12 and the front surface of the object 9 is kept constant. A solid line 831 is a straight line which is obtained from the circles with the least squares method and represents a continuous linear relationship between the displacement current and the electrode voltage. Triangles represent measurement results which are obtained in a state where an amplitude of the vibrating electrode 12 is made smaller than that in the above case of circles while keeping the distance between the vibrating electrode 12 and the front surface of the object 9 constant. Squares represent measurement results which are obtained in a state where the amplitude of the vibrating electrode 12 is made still smaller than that in the case of triangles. A dashed line 832 is a straight line derived from the triangles and a dot-and-dash line 833 is a straight line derived from the squares.

As shown by the straight lines 831 to 833 in FIG. 8, the relationships between the displacement current and the electrode voltage are represented linearly, and as the amplitude of the vibrating electrode 12 increases, the slope decreases. The straight lines 831 to 833 meet at a point 834. Since the point 834 is independent from the amplitude of the vibrating electrode 12, similarly to the first preferred embodiment, it is assumed that the displacement current is not actually generated at the point 834 by change of the capacitance between the vibrating electrode 12 and the object 9. Therefore, in principle, it can be presumed that the reference voltage Vs at the point 834 is equal to the surface voltage on the object 9. Like the first preferred embodiment, since effects of the stray capacitance can be removed from the displacement current, higher-precision measurement can be performed easily. In the surface voltmeter 1a performing change of the amplitude, it is possible to measure the surface voltage through only electrical control and achieve simplification of the construction of the apparatus. Similarly to the first preferred embodiment, there may be a case where the object 9 is not placed on the stage 11, and the reference voltage is acquired and stored in the memory to perform calibration for actual measurement.

As discussed above, change of the amplitude of the vibrating electrode 12 may be performed in stead of change of the distance between the vibrating electrode 12 and the front surface of the object 9. The measurement conditions may be changed by a measurement condition changing part other than the elevation mechanism 14 and the amplitude changing circuit 231, as long as the relationship between the displacement current from the conductive surface 111 and the electrode voltage is changed. By acquiring a plurality of relationships between the displacement current and the voltage which correspond to a plurality of measurement conditions, the computer 3 which is the operation part can obtain the reference voltage Vs which is independent from the plurality of measurement conditions, and obtain the surface voltage on the object 9 on the basis of the reference voltage Vs. For example, by providing the oscillator 23 with a vibration frequency changing circuit, it is possible to acquire a plurality of relationships between the displacement current and the electrode voltage which correspond to a plurality of vibration frequencies, and obtain the surface voltage on the object 9 through the same process. Also in the case of FIG. 8, the reference voltage Vs may be out of a range of the electrode voltage under the plurality of measurement conditions, similarly to the case of FIG. 6.

In the first preferred embodiment, the distance, which is the measurement condition, between the vibrating electrode 12 and the front surface of the object 9, can be mechanically and easily changed and in the second preferred embodiment, the amplitude, which is the measurement condition, of the vibrating electrode 12, can be electrically and easily changed. At this time, since higher-precision measurement of the distance between the vibrating electrode 12 and the front surface of the object 9 or the amplitude of the vibrating electrode 12 is not necessary, it is possible to extremely easily perform the measurement and calibration operations of the surface voltage.

Though the preferred embodiments of the present invention have been discussed above, the present invention is not limited to the above-discussed preferred embodiments, but allows various variations.

Though the surface voltmeters in accordance with the above preferred embodiments are suitable for a semiconductor substrate which requires measurement of a small surface voltage, the object 9 to be measured is not limited to a semiconductor substrate but may be a plate-like insulating material or a conductive material where an insulating film is formed on the front surface thereof. In the case of the semiconductor substrate, normally, an (native) oxide film is formed on the rear surface and the state of rear surface is the same as the case where an insulating material is placed on the conductive surface 111. Though not described above, since the capacitance between the object 9 which is a plate-like insulating material (or which is regarded as an insulating material) and the conductive surface 111 is extremely larger than that between the vibrating electrode 12 and the object 9, effects on the displacement current by the capacitance between the object 9 and the conductive surface 111 is very small.

For making the capacitance between the object 9 and the conductive surface 111 large, it is preferable that an area of the conductive surface 111 is equal to or larger than 100 times that of a top of the vibrating electrode 12. However, the conductive surface 111 does not need to contact with (or close to) the whole rear surface of the object 9, and the area of the conductive surface 111 may be smaller than that of the object 9. In a case where the object 9 is made of a conductive material or a semiconductor and the rear surface of the object 9 has conductivity or semiconductivity, it is not necessary to consider the capacitance between the object 9 and the conductive surface 111. Therefore, as long as conduction between the rear surface of the object 9 and the conductive surface 111 can be established, the area of the conductive surface 111 may be smaller than that of the object 9, and for example, the conductive surface 111 may be a tip surface of a contact terminal.

Though in the above preferred embodiments (an amount of) displacement current is specified by the current specifying voltage and the electrode voltage is controlled through feedback control so that the displacement current from the conductive surface 111 is made equal to the specified displacement current, there may be a case where the electrode voltage is specified and the displacement current corresponding to the specified electrode voltage is acquired. Even in such a case, since there is a possibility deviation occurs between the specified electrode voltage and the actual electrode voltage, it is preferable to provide a circuit for directly acquiring the actual electrode voltage.

Though it is preferable the number of the plurality of straight lines representing the relationships between the displacement current and the electrode voltage which are used for calculation of the reference voltage is greater, in measurement principle, the surface voltage on the object 9 can be obtained by only acquiring two straight lines under two measurement conditions.

A measurement range of the surface voltage on the object 9 which is measured by the surface voltmeters 1, 1a is not limited to the ranges shown in FIGS. 3 and 6, and for example, the surface voltmeters 1, 1a may be used for measuring a surface voltage of several kV.

A mechanism for mechanically changing the distance between the vibrating electrode 12 and the front surface of the object 9 may be constituted to move upward and downward the stage 11.

While the invention has been shown and described in detail, the foregoing description is in all aspects illustrative and not restrictive. It is therefore understood that numerous modifications and variations can be devised without departing from the scope of the invention.

This application claims priority benefit under 35 U.S.C. Section 119 of Japanese Patent Application No. 2006-65057 filed in the Japan Patent Office on Mar. 10, 2006, the entire disclosure of which is incorporated herein by reference.

What is claimed is:
1. A surface voltmeter for measuring a surface voltage on a plate-like object, comprising:
   a stage having a conductive surface on which a plate-like object is placed;
   a vibrating electrode facing a surface of said object in a noncontact manner;
   a vibration part for vibrating said vibrating electrode in a direction toward said object;
   a control part which acquires a relationship between displacement current and electrode voltage of said vibrating electrode, said displacement current being measured at said conductive surface of said stage while said vibrating electrode is vibrating;
   a measurement condition changing part which changes a measurement condition for changing a relationship between displacement current and electrode voltage; and
   an operation part for obtaining a surface voltage on said object from a plurality of relationships between displacement current and electrode voltage, said plurality of relationships corresponding to a plurality of measurement conditions.
2. The surface voltmeter according to claim 1, wherein said control part obtains electrode voltages where values of displacement currents are respectively made equal to specified current values, through feedback control.
3. The surface voltmeter according to claim 2, wherein electrode voltages are directly obtained in acquiring a relationship between displacement current and electrode voltage.

4. The surface voltmeter according to claim 1, wherein
said measurement condition changing part is a mechanism for changing a distance between said vibrating electrode and said surface of said object.

5. The surface voltmeter according to claim 4, wherein
said operation part obtains a reference voltage of said vibrating electrode which is independent from said plurality of measurement conditions, from said plurality of relationships between said displacement current and said electrode voltage, and obtains a surface voltage on said object on the basis of said reference voltage.

6. The surface voltmeter according to claim 1, wherein
said measurement condition changing part is a circuit for changing an amplitude of said vibrating electrode.

7. The surface voltmeter according to claim 6, wherein
said operation part obtains a reference voltage of said vibrating electrode which is independent from said plurality of measurement conditions, from said plurality of relationships between said displacement current and said electrode voltage, and obtains a surface voltage on said object on the basis of said reference voltage.

8. The surface voltmeter according to claim 1, wherein
said operation part obtains a reference voltage of said vibrating electrode which is independent from said plurality of measurement conditions, from said plurality of relationships between said displacement current and said electrode voltage, and obtains a surface voltage on said object on the basis of said reference voltage.

9. The surface voltmeter according to claim 8, further comprising:
a memory for storing a predetermined value, wherein said operation part obtains a surface voltage on said object by adding or subtracting said predetermine value to/from said reference voltage.

10. The surface voltmeter according to claim 8, wherein
said reference voltage is out of a range of electrode voltage under said plurality of measurement conditions.

11. A surface voltage measurement method of measuring a surface voltage on a plate-like object comprising the steps of:
a) placing a plate-like object on a conductive surface of a stage and facing a vibrating electrode to a surface of said object in a noncontact manner;
b) vibrating said vibrating electrode in a direction toward said object;
c) acquiring a relationship between displacement current and electrode voltage of said vibrating electrode, said displacement current being measured at said conductive surface of said stage a while said vibrating electrode is vibrating;
d) changing a measurement condition for changing a relationship between displacement current and electrode voltage and repeating said step c); and
e) obtaining a surface voltage on said object from a plurality of relationships between displacement current and electrode voltage, said plurality of relationships corresponding to a plurality of measurement conditions and being acquired in said steps c) and d).

12. The surface voltage measurement method according to claim 11, wherein
electrode voltages where values of displacement currents are respectively made equal to specified current values are obtained through feedback control in said step c).

13. The surface voltage measurement method according to claim 12, wherein
electrode voltages are directly obtained in said step c).

14. The surface voltage measurement method according to claim 11, wherein
a distance between said vibrating electrode and said surface of said object is changed in said step d).

15. The surface voltage measurement method according to claim 14, wherein
a reference voltage of said vibrating electrode which is independent from said plurality of measurement conditions is obtained from said plurality of relationships between said displacement current and said electrode voltage, and a surface voltage on said object is obtained on the basis of said reference voltage in said step e).

16. The surface voltage measurement method according to claim 11, wherein
an amplitude of said vibrating electrode is changed in said step d).

17. The surface voltage measurement method according to claim 16, wherein
a reference voltage of said vibrating electrode which is independent from said plurality of measurement conditions is obtained from said plurality of relationships between said displacement current and said electrode voltage, and a surface voltage on said object is obtained on the basis of said reference voltage in said step e).

18. The surface voltage measurement method according to claim 11, wherein
a reference voltage of said vibrating electrode which is independent from said plurality of measurement conditions is obtained from said plurality of relationships between said displacement current and said electrode voltage, and a surface voltage on said object is obtained on the basis of said reference voltage in said step e).

19. The surface voltage measurement method according to claim 18, wherein
a surface voltage on said object is obtained by adding or subtracting said predetermine value to/from said reference voltage.

20. The surface voltage measurement method according to claim 18, wherein
said reference voltage is out of a range of electrode voltage under said plurality of measurement conditions.

* * * * *